(12) United States Patent
Gottsche et al.

(10) Patent No.: US 7,490,281 B2
(45) Date of Patent: Feb. 10, 2009

(54) SEGMENTED ALGORITHMIC PATTERN GENERATOR

(75) Inventors: Amy J. Gottsche, Cocoa Beach, FL (US); Philip Theodoseau, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/774,170

(22) Filed: Jul. 6, 2007

(65) Prior Publication Data

US 2008/0016423 A1   Jan. 17, 2008

Related U.S. Application Data

(63) Continuation of application No. 10/710,802, filed on Aug. 4, 2004, now Pat. No. 7,290,187.

(51) Int. Cl.
 *G01R 31/28* (2006.01)
(52) U.S. Cl. .................... 714/738; 714/728; 714/735; 714/739
(58) Field of Classification Search ............. 714/728, 714/735, 738, 739
See application file for complete search history.

(56) References Cited

U.S. PATENT DOCUMENTS

| | | | |
|---|---|---|---|
| 4,994,732 A | 2/1991 | Jeffrey et al. | |
| 5,010,552 A | 4/1991 | Dias et al. | |
| 5,097,468 A | 3/1992 | Earlie | |
| 5,430,736 A | 7/1995 | Takeoka et al. | |
| 5,802,075 A | 9/1998 | Carpenter et al. | |
| 5,862,149 A | 1/1999 | Carpenter et al. | |
| 5,872,797 A | 2/1999 | Theodoseau | |
| 6,044,480 A | 3/2000 | Keen | |
| 6,092,225 A | 7/2000 | Gruodis et al. | |
| 6,212,667 B1 | 4/2001 | Geer et al. | |
| 6,314,540 B1 | 11/2001 | Huott et al. | |
| 6,615,380 B1 | 9/2003 | Kapur et al. | |

FOREIGN PATENT DOCUMENTS

| | | |
|---|---|---|
| JP | 2-24584 | 1/1990 |
| JP | 2001-349930 | 12/2001 |

OTHER PUBLICATIONS

C.W. Cha, et al., "Array Test Pattern Generation Algorithms for a Per Pin Tester", IBM Technical Disclosure Bulletin, vol. 30, No. 10, Mar. 1988.
J.T. Muhr, et al., "Test Pattern Generation for Partitioned Programmable Logic Arrays", IBM Technical Disclosure Bulletin, vol. 26, No. 3B, Aug. 1983.
P.Y.W. Au, et al., "Technique for VLSI In-Circuit Testing", IBM Technical Disclosure Bulletin, vol. 31, No. 4, Sep. 1988.

*Primary Examiner*—Jacques Louis-Jacques
*Assistant Examiner*—John J Tabone, Jr.
(74) *Attorney, Agent, or Firm*—Anthony J. Canale; Greenblum & Bernstein P.L.C.

(57) ABSTRACT

A segmented algorithmic pattern generator engine producing a test signal pattern made of vectors divided into fully definable segments. The engine allows defining processing controls to allow offsets of individual vectors relative to one another and defining additional pattern control formats. Also provided are reducing the pattern format depths in defining counter dimensions within each segment. Single vectors or vector group sequences may be defined at any point as well. The system allows the user control of the pattern generator to compensate for tool and/or device under test latency timing issues. Inputs may be combined and processed into one contiguous pattern of vectors which are definable by the user.

20 Claims, 2 Drawing Sheets

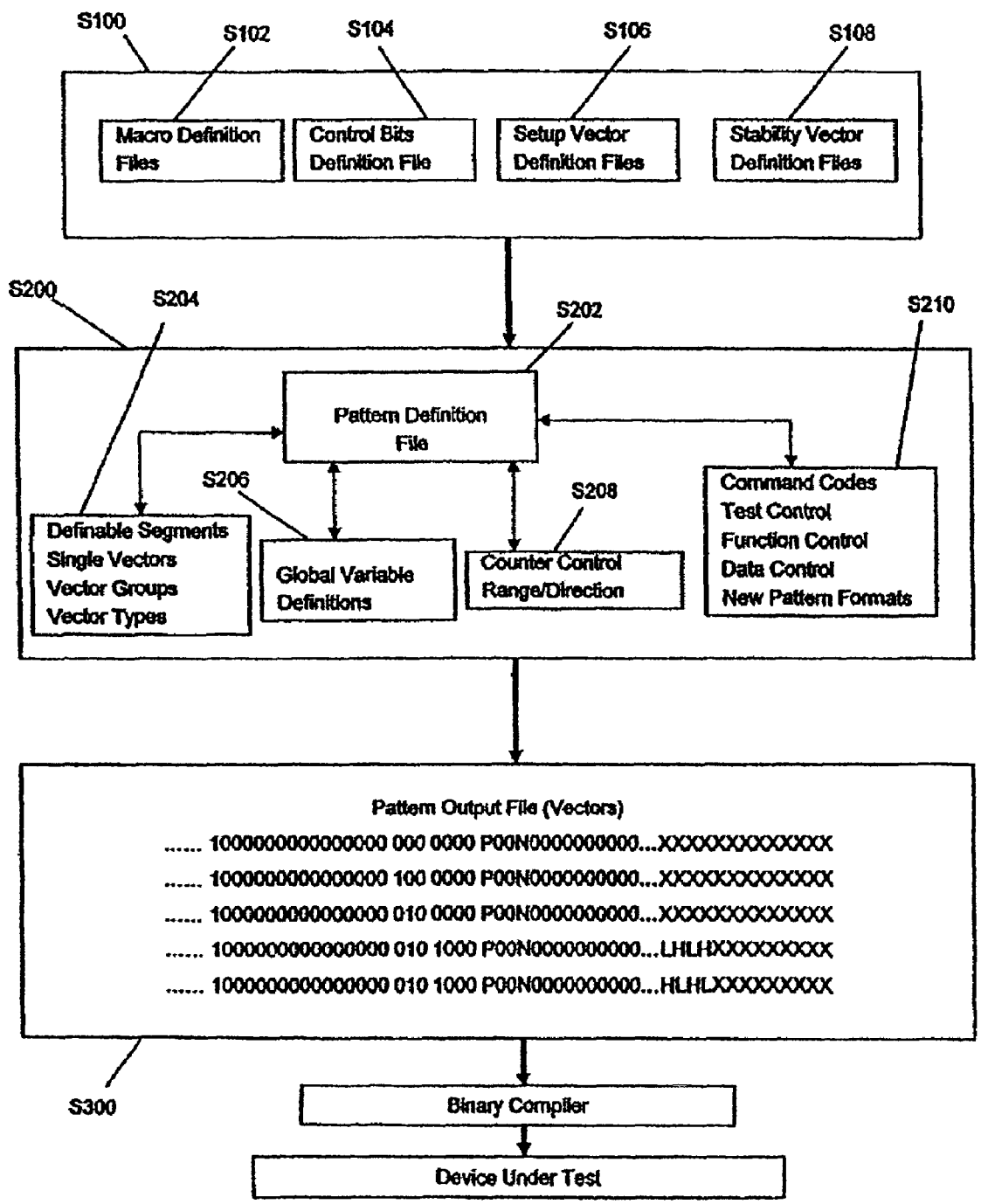

SEGMENTED ALGORITHMIC PATTERN GENERATOR

CROSS-REFERENCE TO RELATED APPLICATIONS

This application is a continuation application of U.S. patent application Ser. No. 10/710,802 filed on Aug. 4, 2004, now U.S. Pat. No. 7,290,187, the contents of which are incorporated by reference in their entirety.

BACKGROUND OF THE INVENTION

1. Field of the Invention

The invention relates to electronic circuit testing, and more particularly to generating signals to exercise and test an integrated circuit.

2. Background Description

As the complexity of integrated circuits has increased, a need has arisen for more sophisticated testing, exercising, and burn-in procedures. Additionally, the increased complexity of integrated circuits means more pin connections must be tested as well as requiring testing signals of increasing complexity to test as much functionality of the device under test as reasonably possible. Furthermore, as the performance requirements of integrated circuits have increased, acceptable manufacturing tolerances of integrated circuits have narrowed.

Accordingly, testing signal requirements have grown in complexity, requiring substantial amounts of time to program such complex testing signals into a pattern generator. For example, some inputs on an integrated circuit may require a "pre-signal" at a particular pin to precondition the internal circuitry connected to the pin before receiving the actual test signal. Such pre-signals may be required, for example, in order for the circuit to respond to an input signal as intended by the circuit designer. Thus, a system which allows designing a particular testing signal, and further allows the particular testing signal to be delivered as a pre-signal before the testing cycle actually begins is desirable.

Additionally, integrated circuit exercising may require alternating between signals which burn-in or exercise the integrated circuit with signals that test the functionality of the integrated circuit. Periodic testing during burn-in increases testing throughput by allowing circuits that have prematurely failed to be replaced by the next circuit needing testing. Accordingly, alternating between burn-in or exercise signals and testing signals may require extremely complex test patterns.

Furthermore, testing signals may require numerous signals, for example thousands, which are based on a preselected base signal which varies in a particular way with each repetition. Such a variation may progressively change with each repetition since individually programming thousands of different signals is impractical. A way to generate a base signal including specifying a variation with each repetition can simplify the creation of testing signal patterns. Also, some pins of an integrated circuit undergoing an exercising procedure may require a particular test signal out of many test signals to be selectively repeated. Thus, a need arises for a testing system which has memory capability attached to each pin input and allows the particular test signal, such as the most recent test signal, to be saved and recalled at predetermined times.

Hardware on new test systems typically have pipeline delays in various sections of the tool. Writing patterns which can control these offsets and still maintain the pattern has been a difficult task. Previously there was no known pattern generator that could handle such offsets. However, improvements in technology have recently been developed which allow breaking apart of various segments of a signal into individual components and controlling the output from macros creating the segments independently by either advancing or delaying them. Because such pattern generators offer so many signal possibilities, they require substantial amounts of operator time to set up a particular signal for testing purposes.

SUMMARY OF THE INVENTION

In a first aspect of the invention, a method comprises testing an electronic circuit which includes defining a first initial vector, and defining at least one segment within the first initial vector. The method also includes offsetting the first initial vector a predetermined amount within the at least one segment, and defining a counter loop comprising loops of the first initial vector within the at least one segment to produce a first set of vectors in accordance with the counter loop. The method additionally includes defining a progressively changing variation of the first initial vector for each loop of the counter loop so at least one vector of the first set of vectors varies from the first initial vector, and coupling the at least one segment having the first set of vectors including the varied at least one vector to produce a final pattern for a circuit under test.

In another aspect of the invention, a method of generating a test pattern includes selecting a macro definition file defining at least one vector, and forming a control bit definition file configured to be added to the at least one vector. The method also includes creating a pattern definition file configured to selectively alter a portion of the at least one vector creating a global definition file configured to alter the entire vector. The method additionally includes combining the macro, control bit, pattern formats, and global definition files to form a final vector to produce a final pattern.

A computer program product is also provided comprising a computer usable medium having readable program code embodied in the medium. The computer program product includes at least one program code to define a first initial vector, and define at least one segment within the first initial vector. The computer program product also has code to offset the first initial vector a predetermined amount within the at least one segment, and define a counter loop comprising loops of the first initial vector within the at least one segment to produce a first set of vectors in accordance with the counter loop. The computer program product additionally has code to define a progressively changing variation of the first initial vector for each loop of the counter loop so at least one vector of the first set of vectors varies from the first initial vector, and coupling the at least one segment having the first set of vectors including the varied at least one vector to produce a final pattern for a circuit under test.

BRIEF DESCRIPTION OF DRAWINGS

FIG. 2 is a flow chart of an embodiment showing steps of using the invention.

DETAILED DESCRIPTION OF THE INVENTION

Figure 1:
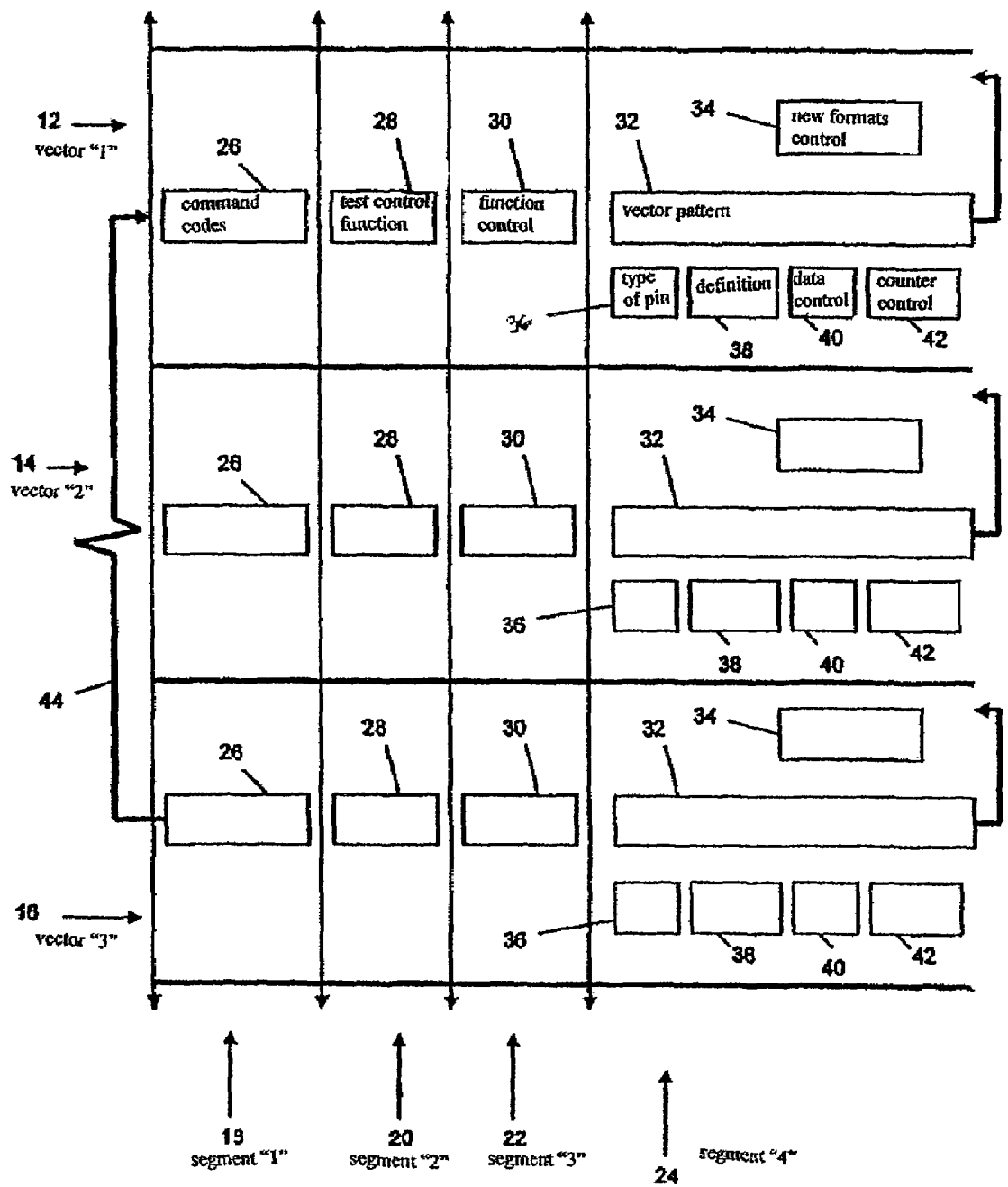
FIG. 1 is a schematic diagram of an embodiment of the invention.

Due to the testing complexities required by modern integrated circuit designs, a testing system including a pattern generator which produces a wide variety of test signals or vectors is provided. The pattern generator produces segmented algorithmic patterns, and each segment may be individually controlled before being assembled into the pattern.

Some products and tooling advances require more complex pattern generation support than what has existed in the past. To support pipelining and certain pattern complexity requirements, it is desirable to apply an offset to the application of stimulus to the device under test to certain cells when a vector is executed. Embodiments of the pattern generator include fully definable segments, and also allow defining of vector processing controls to allow offsets. The pattern generator also allows defining additional pattern control formats, and reducing the pattern format depths. The invention also allows defining counter dimension within each segment, and defining any single vector or vector group sequence at any point.

Referring to FIG. 1, the components which make up a segmented algorithmic pattern generator engine are shown. The overall pattern output of the pattern generator engine in this example is made up of three vectors, vector "1", vector "2" and vector "3", 12, 14 and 16, respectively. Each vector applies a test signal to each channel of a device under test. As shown, the vectors are separate, but may be chained together in any number of configurations or iterations to form a final pattern. The final pattern is representative of the test signals to be delivered to the device under test.

Although the example shows three vectors, other examples of segmented patterns may include many thousands or even tens of thousands of vectors. Thus, the vector segmenting of FIG. 1 is just one illustrative example and should not be considered as a limiting feature of the invention. Each vector, 12, 14 and 16, of the final pattern is controlled by various functions which may be considered to be allocated into various vertically aligned segments, 18, 20, 22 and 24 of the pattern generator engine, as discussed.

Generation of a test signal may be divided into various segments, with each segment creating a predetermined component of the final vector. For example, vector "1", 12, may be divided into the four segments, 18, 20, 22 and 24, where each segment affects some aspect of functionality of vector "1", 12. This starting vector may also be referred to as a seed vector, a basic vector or an initial vector. As shown, segment "1", 18, of vector "1", 12, includes the functionality of command codes 26. Command codes 26 are predefined vector patterns allowing a user to easily specify the functionality of the particular vector. In other words, the command codes function 26 provides preprogrammed vectors which may form a component of the vector "1", 12. The command codes function 26, for example, can tell the system to run or delay a vector, as well as rerun a vector. Additionally, command codes function 26 may include a loop code which tells the vector to loop. Virtually any command code known in the art may be included in segment "1", 18. Thus, the command codes function 26 provides a method of creating a basic well-defined vector.

Segment "2", 20, includes test control function 28. The test control function 28 controls the vector pattern, and also allows the vector pattern to be overridden by a second vector pattern. The test control function 28 includes commands designed to exercise global control of a tester on an entire vector or command code. For example, the test control function 28 includes commands to inhibit a test signal and control fault data. The test control function 28 also includes commands to inhibit other commands such as interrupt commands. As such, the test control function 28 provides an additional level of functionality of the vector "1", 12, over the command codes function 26. Segment "3", 22, includes a function control 30. Thus, the test control function 28 increases flexibility in vector creation.

The function control 30 allows a memory system associated with particular pins of the integrated circuit being tested to be utilized to store and retrieve vectors. The retrieved vector may be used where signal repetition is needed, without requiring a repeated signal to be programmed into the pattern. Thus, the function control 30 allows a user such as an operator or engineer to customize vectors created by other operations. It should be noted that in implementation, each of the segments, 26, 28 and 30 may contribute in any amount towards creating the vector "1", 12.

Segment "4", 24, includes the vector pattern 32 which is the pattern output file for the vector "1", 12. The vector pattern 32 includes commands calling actual industry standard vector patterns used by the particular system to control the drivers which are delivering the test signal to the device under test. The vector pattern 32 may include modified standard vector patterns, as well. For example, the vector patterns 32 may call a standard square wave vector which has its pulse width modified by a specified amount. Segment "4", 24, allows additional functionality control of vector "1", 12. For example, segment "4", 24, allows additional information such as further control instructions to be associated with the vector "1", 12.

The type of pin 36 and definition 38 may be specified. The type of pin 36 includes information relating to the pin contact of the integrated circuit that the vector "1", 12 is coupled to. For example, the type of pin 36 may include information indicating to the tester that the pin of a device under test receiving a particular test signal is an input only pin, an output only pin, an input/output pin or a power pin. The definition 38 is able to specify a user name for the target pin, and allows pins to be grouped together under one name depending on the pin type such as a clock pin, data pin, address pin, etc. For example, a subgroup of all the clock pins of a device may be defined as "clock group A" to allow sending a signal to the entire subgroup simply by specifying "clock group A".

Also included are data control 40 and counter control 42. The data control 40 specifies different inputs of the vector "1", 12, such as standard mode, for example hexadecimal mode, binary format modes, etc. The counter control 42 allows a certain number of loops of the vector "1", 12 to be specified. For example, the final form of vector "1", 12, may be specified to repeat or loop 2, 3, 10 or more times. Also included in segment "4", 24, is a new formats control 34.

New formats control 34 allows additional wave forms or vectors to be added in addition to the standard wave forms making up the vector "1", 12. Such additional waveforms may include new industry standard waveforms created as new integrated circuit designs are developed requiring new standard testing signals.

Accordingly, type of pin 36, definition 38, data control 40, and counter control 42, and new formats control 34 of segment "4", 24, allow additional wave form shaping in addition to the shaping and formation provided by command codes function 26, test control functions 28, and function control 30. Also included is a capability for looping 44 to any single vector or group of vectors.

As such, the segmented algorithmic pattern generator engine is capable of producing a pattern made up of segments having a single vector or multiple vectors where the pattern can loop to any single vector or group of vectors. Additionally, the vectors making up the pattern may be sequential or overlapping and may include thousands and even tens of thousands of vectors. One of the features of the generator engine allows for shifting of each segment relative to the other segments which allows for overlapping, mixing and offsetting of segments, 18, 20, 22, 24 of the vectors 12, 14 and 16 in any desired combination. The generator engine may also allow for "compression" where numerous vectors can be generated based on just a few commands creating a basic vector and a progressive variation of loops of the basic vector.

In use, an individual vector of the pattern may contain command codes which instruct the system to execute certain functions such as run, delay, loop, etc. Additionally, the system provides a test control function which controls the vector pattern, and may override the vector pattern. Also included is a function control which reduces the number of vectors specifically programmed into the segment by allowing particular vectors to be stored in memory and repeated. Additionally, the segment includes a vector pattern output file which contains the actual test input signal, and which also includes selectable parameters such as pin number, a user defined label or name for the pin, additional input data, and number of loops for the vector pattern. The segment may also include a format function which allows new wave forms to be added in addition to standard wave forms making up the vector pattern. All of these functions may be selectively applied to the vector pattern to produce a segment generating a test signal having the desired properties. Additionally, multiple segments may be added together to produce a final pattern for test, exercise or burn-in purposes.

FIG. 2 is a flow diagram of an embodiment showing steps of using the invention beginning at S100. FIG. 2 may equally represent a high-level block diagram of components of the invention implementing the steps thereof. The steps of FIG. 2 may be implemented in computer program code in combination with the appropriate hardware. This computer program code may be stored on storage media such as a diskette, hard disk, CD-ROM, DVD-ROM or tape, as well as a memory storage device or collection of memory storage devices such as read-only memory (ROM) or random access memory (RAM). Additionally, the computer program code can be transferred to a workstation over the Internet or some other type of network. FIG. 2 may also be implemented, for example, using the components represented by FIG. 1.

Continuing with the flow diagram of FIG. 2, the pattern generator processing flow chart shows the various steps, that, when combined form making a pattern. The processing flow chart is made up of three general steps, S100, S200 and S300. The first general step S100 includes forming macro definition files S102 and control bit definition files S104. The first general step S100 also includes setting up vector definition files S106 and creating stability vector definition files S108. These files may be combined to form the output of S300. The form of the output from S300 generally includes commands in ASCII format sent to a electronic signal generator. The output from S300 may be received and converted by some electronic signal generators into a format compatible with the format requirements of the electronic signal generator. Such a conversion may include processing the output from S300 using a translator or a binary compiler.

Forming the macro definition files S102 includes utilizing a group of commands describing the vector patterns where the vector waveforms are predefined. This predefined waveform vector may include, for example, a sine wave or a square wave having a preselected frequency and amplitude. The commands may include external macros which may be configured to run an analog to digital converter to generate a vector having a predefined shape based on the particular macro selected. The control bits definition file S104 allows naming control bits which may be later added to the vector by calling the name of the definition file.

The setup vector definition files S106 specifies certain vectors used to power up the device under test. The setup vector definition files S106 are typically run only once at the beginning of the test of a device. Also included in the first general step S100 are the stability vector definition files S108. The stability vector definition files S108 are typically run during the dead time between the actual test vectors called by the macro definition files S102. The stability vector definition files S108 are run during dead time to help stabilize the device under test during periods of testing signal quiescence and usually consist of a non-intrusive state such as a continuous "0" or "1," a "float" or a "don't care" signal between the actual testing vectors. This is done by outputting the requisite binary format code.

The second general step S200 includes creating the pattern definition file S202 and specifying variables to be included in the pattern S204. The second general step S200 also includes creating the global variable definitions S206 and defining the counter control range/direction S208. General step S200 also includes a codes controls step S210.

Defining variables S204 includes definable segments, single vectors, vector groups and vector types, for example. S204 also includes any variable that may be included in the pattern being generated. Thus, the definable segments are the various segments that are incorporated into the pattern. The definable segments may also include single vectors and vector groups arranged either sequentially and/or concurrently. Additionally, S204 includes specifying the vector types for the segment.

S206 includes defining the global variable definitions. The global variable definitions S206 are variables which may affect the entire pattern. For example, a global variable definition S206 may include the use of key address bits to effect an address change to a data bit for reclassification of the address to generate a certain physical data pattern to the device under test via a selected Boolean expression. S208 includes counter control range/direction. Counter control range/direction controls the counters which control the various loops of the pattern. Thus, the counter control may include a total number of loops as well as a counting direction either up or down, for example, of such loops.

S210 controls forming the final pattern and includes the implementation of command codes, test controls, and function controls which affect the final shape of the vector. S210 also includes data control and new pattern formats. The data control allows all of a data output to be inverted or complimented with a single command such as would be done by overriding a global definition. The new pattern formats allows adding a new type of stimulus vector or pulse by specifying a function defining the new type of vector or pulse. S210 allows combining all of the information having global definitions, and adds all these files together to create the pattern.

General step S300 is a representation of the pattern output file which is made up of all of the vectors created by the steps of S100 and S200. Pattern output file S300 includes at least one but may also include multiple vectors. The structure of the vectors is such that the length of each vector corresponds to the bandwidth of the device under test. The bandwidth of the device under test may be determined, for example, by the number of pin connections of the device. The length of each vector may be subdivided into segments. Furthermore, multiple vectors can be combined together as represented by the multiple vectors in the vertical direction, to form a group of vectors which has been compressed to the final pattern.

As should now be understood, an embodiment of the pattern generator includes a method of defining the pattern generator input and output into segments, and allowing user control of the pattern generator to compensate for tool and/or product latency timing requirements. The method combines and processes inputs into one contiguous pattern comprising a set of user defined vectors. This provides for integration of the pattern vertically (through format segments) or horizontally (through vector segments) within the pattern generator. Vector segments may include a single vector, multiple vectors, or a group of vectors linked together through the pattern generator.

Also, semiconductor testing processes require various software tools to help facilitate the generation of patterns. The invention, however, may create complicated test patterns. Such patterns are critical in providing the necessary field data to determine the reliability of the product. The embodiments discussed herein thus provide methods of inputting a set of conditions and criteria in order to generate a segmented set of test patterns to be used in a test/stress system. An embodiment includes generating patterns which allow the flexibility of defining and generating independently defined macro segments within the scope of the pattern.

Writing test patterns for the various test and stress equipment requires that the software tools be flexible enough to adapt to new generations of test equipment. To overcome the major tool enhancements and changes, the pattern generator may be segmented into various tasks to allow independent control over the various counters and macros due to hardware pipeline requirements. These delays or advances in the various pattern segments allow the patterns and tool hardware pipeline to generate the proper stimulants to the device under test.

While the invention has been described in terms of exemplary embodiments, those skilled in the art will recognize that the invention can be practiced with modifications and in the spirit and scope of the appended claims.

What is claimed is:

1. A method for testing an electronic circuit, comprising:
   defining a first initial vector;
   defining at least one segment within the first initial vector;
   offsetting the first initial vector a predetermined amount within the at least one segment;
   defining a counter loop comprising loops of the first initial vector within the at least one segment to produce a first set of vectors in accordance with the counter loop;
   defining a progressively changing variation of the first initial vector for each loop of the counter loop so at least one vector of the first set of vectors varies from the first initial vector; and
   coupling the at least one segment having the first set of vectors including the varied at least one vector to produce a final pattern for a circuit under test.

2. The method of claim 1, wherein defining the first initial vector comprises selecting a predefined vector pattern.

3. The method of claim 2, wherein defining the first initial vector further comprises at least one of running a vector, delaying a vector, rerunning a vector, and looping a vector.

4. The method of claim 1, further comprising overriding the first initial vector with a second vector.

5. The method of claim 1, further comprising selecting an input pin on a device to be tested for the first initial vector.

6. The method of claim 5, further comprising defining a name for the input pin on the device to be tested.

7. The method of claim 1, further comprising defining a counter, and looping the first initial vector a prescribed number of times in accordance with the counter.

8. The method of claim 1, further comprising defining a data control vector to allow a prescribed input format of the first initial vector.

9. The method of claim 1, further comprising defining a new format vector to be added to the first initial vector to reconfigure the shape of the first vector.

10. The method of claim 1, further comprising:
    defining a second vector;
    allocating a second segment configured to contain the second vector; and
    offsetting the second vector a predetermined amount within the second segment.

11. The method of claim 10, further comprising:
    defining a counter loop comprising loops of the second vector within the second segment to produce a second set of vectors having a prescribed number of vectors in accordance with the counter loop;
    defining a progressively changing variation of the second vector for each loop of the counter loop so at least one vector of the second set of vectors varies from the second vector; and
    outputting the second segment having the second set of vectors.

12. A computer program product comprising a computer storage medium having readable program code tangibly embodied on the medium, the computer program product including at least one program code to:
    define a first initial vector;
    define at least one segment within the first initial vector;
    offset the first initial vector a predetermined amount within the at least one segment;
    define a counter loop comprising loops of the first initial vector within the at least one segment to produce a first set of vectors in accordance with the counter loop;
    define a progressively changing variation of the first initial vector for each loop of the counter loop so at least one vector of the first set of vectors varies from the first initial vector; and
    coupling the at least one segment having the first set of vectors including the varied at least one vector to produce a final pattern for a circuit under test.

13. The computer program product of claim 12, wherein the at least one program code to define the first initial vector selects a predefined vector pattern.

14. The computer program product of claim 13, wherein the at least one program code to define the first initial vector at least one of runs a vector, delays a vector, reruns a vector, and loops a vector.

15. The computer program product of claim 12, further comprising at least one program code to override the first initial vector with a second vector.

16. The computer program product of claim 12, further comprising at least one program code to select an input pin on a device to be tested for the first initial vector.

17. The computer program product of claim 12, further comprising at least one program code to define a counter, and loop the first initial vector a prescribed number of times in accordance with the counter.

18. The computer program product of claim 12, further comprising at least one program code to define a data control vector to allow a prescribed input format of the first initial vector.

19. The computer program product of claim 12, further comprising at least one program code to:
    define a second vector;
    allocate a second segment configured to contain the second vector; and
    offset the second vector a predetermined amount within the second segment.

20. The computer program product of claim 19, further comprising at least one program code to:

define a counter loop comprising loops of the second vector within the second segment to produce a second set of vectors having a prescribed number of vectors in accordance with the counter loop;

define a progressively changing variation of the second vector for each loop of the counter loop so at least one vector of the second set of vectors varies from the second vector; and output the second segment having the second set of vectors.

* * * * *